United States Patent
Muraoka et al.

[19]

[11] Patent Number: 6,165,916
[45] Date of Patent: Dec. 26, 2000

[54] FILM-FORMING METHOD AND FILM-FORMING APPARATUS

[75] Inventors: Kouichi Muraoka, Sagamihara; Hitoshi Itoh, Tokyo, both of Japan

[73] Assignee: Kabushiki Kaisha Toshiba, Kawasaki, Japan

[21] Appl. No.: 09/150,701

[22] Filed: Sep. 10, 1998

[30] Foreign Application Priority Data

Sep. 12, 1997 [JP] Japan .................. 9-248292

[51] Int. Cl.$^7$ ................ H01L 21/31; H01L 21/469
[52] U.S. Cl. ....................... 438/791; 438/790
[58] Field of Search ................ 438/791, 790, 438/788, 653, 789; 427/248.1

[56] References Cited

U.S. PATENT DOCUMENTS

| | | | |
|---|---|---|---|
| 4,401,054 | 8/1983 | Matsuo et al. ............... | 118/723 |
| 4,444,812 | 4/1984 | Gutsche .................. | 427/255 |
| 4,777,103 | 10/1988 | No et al. .................. | 430/66 |
| 4,873,125 | 10/1989 | Matasuyama et al. ........ | 427/248.1 |
| 5,404,046 | 4/1995 | Matsumoto et al. ......... | 257/750 |
| 5,429,991 | 7/1995 | Iwasaki et al. ............. | 437/192 |
| 5,492,734 | 2/1996 | Matsumoto et al. ......... | 427/535 |
| 5,525,550 | 6/1996 | Kato ....................... | 437/238 |
| 5,605,867 | 2/1997 | Sato et al. ................ | 437/235 |

FOREIGN PATENT DOCUMENTS 2-93071  4/1990  Japan .
9-260373  10/1997  Japan .

*Primary Examiner*—John F. Niebling
*Assistant Examiner*—Walter L. Lindsay, Jr.
*Attorney, Agent, or Firm*—Finnegan, Henderson, Farabow, Garrett & Dunner, L.L.P.

[57] ABSTRACT

The present invention provides a method of forming a film, having the step of allowing a first chemical substance to be adsorbed on a surface of a silicon substrate by a gaseous phase method, and the step of introducing a gas containing a second chemical substance onto the substrate surface having the first chemical substance adsorbed thereon for forming a silicon compound layer on the silicon substrate, the silicon compound layer consisting essentially of a silicon compound formed by a reaction between the first chemical substance adsorbed on the substrate surface and the second chemical substance. The film-forming method of the present invention is featured in that one of the first and second chemical substances contains silicon and the other chemical substance contains an element other than silicon, that the step of forming the silicon compound layer is continued until the reaction between the first chemical substance and the second chemical substance is saturated, and that the step of allowing the first chemical substance to be adsorbed on the substrate surface and the step of forming the silicon compound layer are carried out alternately and a plurality of times.

19 Claims, 10 Drawing Sheets

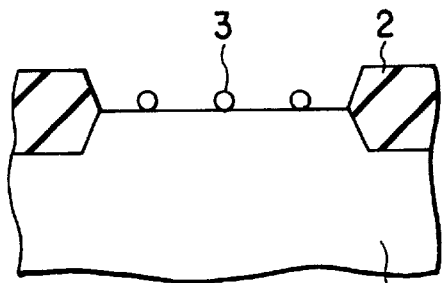
FIG. 3A
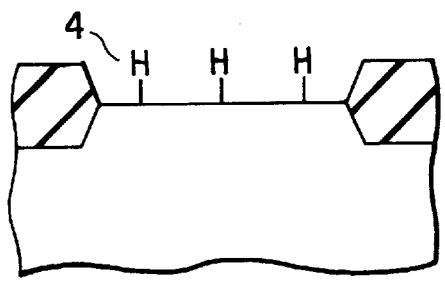
FIG. 3B
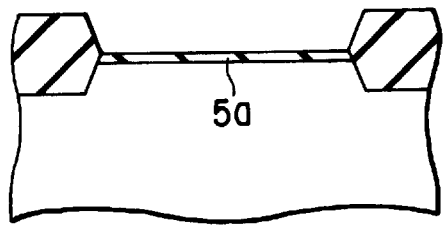
FIG. 3C
FIG. 3D
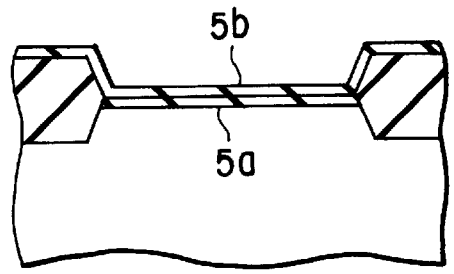
FIG. 3E
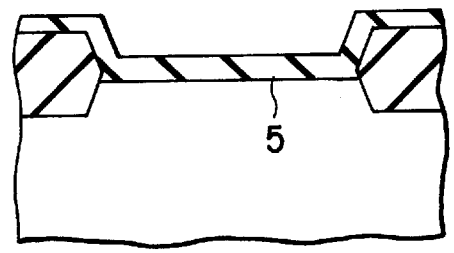
FIG. 3F
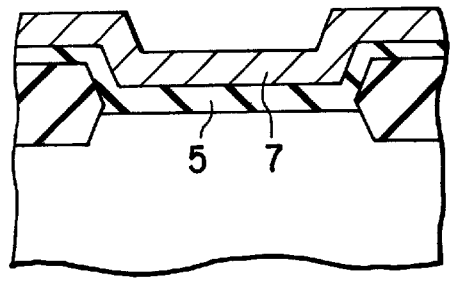
FIG. 3G
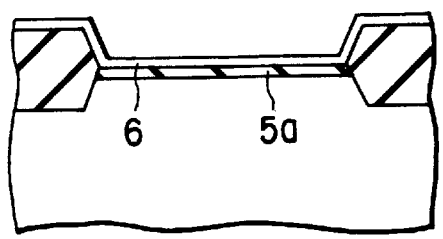

FILM-FORMING METHOD AND FILM-FORMING APPARATUS

BACKGROUND OF THE INVENTION

The present invention relates to a method and apparatus for forming a film, particularly, a method and apparatus used for forming a semiconductor device and effective for forming, for example, a gate insulating film of a high reliability.

In recent years, attentions are paid to a silicon nitride film as a highly reliable gate insulating film of the next generation because the silicon nitride film has a dielectric constant higher than that of a silicon oxide film. To be more specific, in the case of using a silicon nitride film as a gate insulating film, a capacitance larger than that obtained in the case of using a silicon oxide film is obtained even if the gate insulating film is formed thicker. Therefore, the silicon nitride film is expected to overcome the difficulty accompanying the reduction in the thickness of the silicon oxide film, i.e., the difficulty in controlling the thickness of the gate insulating film. It should also be noted that, in the case of using silicon oxide for forming the gate insulating film, boron doped in a $p^+$ polycrystalline silicon gate electrode tends to leak through the gate insulating film into the channel region. In the case of using silicon nitride for forming the gate insulating film, however, the gate insulating film can be formed to have higher film density and thicker, making it possible to prevent boron doped in the gate electrode from leaking through the gate insulating film into the channel region.

Several methods of forming a silicon nitride film are being studied, as summarized below:

(A) Thermal nitridation of a silicon substrate surface using $NH_3$: Required is a high temperature process of 1,000° C. or more. The thickness of the nitride film is saturated at about 3 nm.

(B) Deposition of a nitride film using a CVD method: Generally known are an $SiH_4+NH_3$ system (for formation of an oxidation diffusion mask), an $SiCl_4+HN_3$ system (for formation of a surface protective film), and an $SiH_2Cl_2+NH_3$ system (for formation of an NMOS memory). The film-forming temperature is 700 to 950° C.

(C) Nitriding of a silicon substrate surface using plasma: Reported are a surface nitridation using a nitrogen plasma, a plasma anodic nitridation, and an impurity gas-added plasma nitridation ($N_2+SF_6$). The process temperature falls within a range of between 700° C. and 900° C. in each of these processes. A nitride film having a thickness of scores of nanometers can be obtained.

(D) Deposition of a nitride film using plasma: Many systems are being studied including an $SiH_4+NH_3$ system, $SiH_4+N_2$ system, $Si_2F_6$ (or $SiF_4$)+$N_2$ system, and an $SiH_4+NF_3$ system. Also, an electron cyclotron resonance plasma (ECR), etc. are being studied in addition to the radio frequency plasma.

In recent years, vigorous studies are being made on, particularly, method (B) given above, i.e., the CVD method, as a method of forming a gate insulating film. FIGS. 1A to 1D collectively show the CVD method, i.e., method (B). Specifically, FIGS. 1A to 1D are cross sectional views schematically showing the conventional method of forming a silicon nitride film. In the first step, a field oxide film 42 is formed in a thickness of 800 nm by thermal oxidation on a surface of an n-type silicon substrate 41 having a (100) plane as a main surface.

In the next step, pre-treatments with sulfuric acid-hydrogen peroxide ($H_2SO_4/H_2O_2$), with hydrochloric acid-hydrogen peroxide solution ($HCl/H_2O_2/H_2O$), and with dilute hydrofluoric acid ($HF/H_2O$) are applied successively to the substrate 41 so as to remove organic and metallic contaminants 43 from the surface of the silicon substrate 41. After the pre-treatments, the surface of the substrate 41 is terminated with hydrogen 44 (or modified with hydrogen radical, etc.), as shown in FIG. 1B. Then, the silicon substrate 41 is transferred into a hot wall type reduced pressure CVD furnace, followed by elevating the furnace temperature to 800° C. Under this condition, a mixed gas consisting of $SiH_2Cl_2$ and $NH_3$, which are mixed at a ratio of 1:1, is introduced into the hot wall type reduced pressure CVD furnace so as to deposit a silicon nitride film 45 on the silicon substrate 41, as shown in FIG. 1C. In this step, the total pressure within the CVD furnace is set at 0.8 Torr, and the forming rate of the silicon nitride film 45 is 4 nm/min.

After formation of the silicon nitride film 45, a polycrystalline silicon film 46 is deposited on the silicon nitride film 45 within the CVD furnace using an $SiH_4$ gas as a raw material, as shown in FIG. 1D, followed by taking the silicon substrate out of the CVD furnace. In this fashion, the silicon nitride film 45 having a thickness of about 6 nm is formed as a gate insulating film.

FIG. 2 schematically shows the construction of the hot wall type reduced pressure CVD furnace used in the method described above. As shown in the drawing, the CVD furnace comprises a reaction tube 51 made of quartz and a silicon substrate supporting disk 52 made of quartz. The $SiH_2Cl_2$ gas and the $NH_3$ gas are supplied into the furnace through a pair of gas supply ports 53. These gases are mixed within the furnace and, then, supplied onto the surface of a silicon substrate 50 held on the disk 52.

It has been clarified recently as a result of vigorous studies that the conventional method outlined above gives rise to serious problems. Specifically, where a silicon nitride film is formed by the CVD method described above, solid particles of ammonium chloride ($NH_4Cl$), which is a by-product of the reaction, enter a vacuum pump system 54 so as to make the maintenance and repair of the pump troublesome. Also, it is necessary to remove periodically the silicon nitride film formed on the quartz tube 51 and the substrate supporting disk 52. Further, in the case of forming a silicon nitride film thinner than 6 nm, it is difficult to control the thickness of the silicon nitride film because film-forming rate is high in the CVD method. What should also be noted is that, since the film-forming rate is high, the by-products of $NH_4Cl$ and $H_2$ shown in the reaction formula given below tend to enter the silicon nitride film:

$$3SiH_2Cl_2+10NH_3Si_3N_4+6NH_4Cl+6H_2$$

Further, since the film-forming temperature in the CVD method is as high as 800° C., traces of oxygen, water, carbide, etc. contained in the atmosphere tend to roughen the surface of the silicon substrate in the step of heating the silicon substrate within the furnace. Still further, the silicon nitride film formed in the initial stage of the film formation is subject to surface diffusion so as to bring about grain growth and, thus, results in failure to obtain a flat film. An additional difficulty to be noted is that, if the substrate temperature is lowered after formation of a thick silicon nitride film, stress is generated at the interface between the silicon substrate and the silicon nitride film because of a difference in thermal expansion coefficient between the two, giving rise to problems such as defects, deformation of the network of the silicon nitride film, and slippage of the silicon substrate.

Serious problems are also generated in the conventional methods other than the CVD method, i.e., method (B). For example, the thermal nitridation of a silicon substrate using an ammonia gas involves a high temperature process exceeding 1,000° C., giving rise to slippage of the silicon substrate. Also, the thickness of the silicon nitride film formed is saturated at about 3 nm. When it comes to the nitridation of the silicon substrate or deposition of a nitride film using plasma, the surface of the silicon substrate is exposed to plasma, with the result that the damage done to the substrate by high energy ions and electrons greatly affects adversely the reliability of the insulating film.

The problems inherent in the conventional film-forming method can be summarized as follows.

First of all, the substrate or the insulating film incurs a damage. For example, the substrate or insulating film incurs a plasma damage in the case of using a parallel plate type radio frequency plasma or an ECR plasma. The electrical characteristics of the product semiconductor device are adversely affected by the plasma damage.

A second problem is that the flatness of the substrate surface is lowered. In the case of forming a very thin nitride film by the CVD method or the thermal nitriding method, the nitride film in the initial film-forming stage is highly sensitive to the surface state of the silicon substrate. As a result, the oxygen and organic materials adsorbed on the substrate surface greatly affect adversely the uniformity of the resultant nitride film, leading to a low flatness of the resultant nitride film. Further, a treatment under a high temperature is required for removing the hydrogen terminating the substrate surface, with the result that the substrate surface is roughened by traces of water, oxygen and organic materials contained in the atmosphere.

A third problem is that it is difficult to control the thickness of the silicon nitride film. In the case of using the CVD method, it is difficult to control the film thickness because the film-forming rate is high in the CVD method. On the other hand, in the case of using a thermal nitriding treatment, it is difficult to form a sufficiently thick nitride film because the thickness of the nitride film is saturated at about 3 nm.

A fourth problem is that the formed nitride film contains a high concentration of oxygen, hydrogen, etc.

When it comes to, for example, a CVD process using $SiH_4$ and $NH_3$, a large amount of compounds which are not completely decomposed such as $SiH_x$ and $NH_x$ are taken into the nitride film. Further, the by-product hydrogen, etc. are reported to be recombined with silicon or nitrogen. The hydrogen taken into the nitride film adversely affects the characteristics of the product semiconductor device. For example, the hot carriers of the MOSFET are deteriorated. Also, the resistivity of the silicon substrate is fluctuated. On the other hand, in the case of using an $SiF_4$ series gas, the hydrogen concentration in the nitride film is lowered. However, a large amount of fluorine is taken into the nitride film, leading to an increase in the trap site.

Further, a fifth problem is that much labor is required for the maintenance and repair of the film-forming apparatus. In the conventional film-forming method, disorder of the vacuum pump tends to be brought about by the side product of the reaction. Also, it is necessary to remove periodically the film deposited on the furnace wall.

BRIEF SUMMARY OF THE INVENTION

An object of the present invention is to provide a film-forming method and a film-forming apparatus, which are used in the manufacture of a semiconductor device and which permit forming a silicon compound layer excellent in flatness.

Another object is to provide a film-forming method and a film-forming apparatus, which are used in the manufacture of a semiconductor device and which permit forming a silicon compound layer while controlling the film thickness at a high accuracy.

According to an aspect of the present invention, there is provided a method of forming a film, comprising the step of allowing a first chemical substance to be adsorbed on a surface of a silicon substrate by a gaseous phase method, and the step of forming a silicon compound layer on the silicon substrate by introducing a gas containing a second chemical substance onto the substrate surface having the first chemical substance adsorbed thereon, the silicon compound layer consisting essentially of a silicon compound formed by a reaction between the first chemical substance adsorbed on the substrate surface and the second chemical substance, wherein one of the first and second chemical substances contains silicon and the other chemical substance contains an element other than silicon, the step of forming the silicon compound layer is continued until the reaction between the first chemical substance and the second chemical substance is saturated, and the step of allowing the first chemical substance to be adsorbed on the substrate surface and the step of forming the silicon compound layer are carried out alternately and a plurality of times.

In the method of the present invention, a first chemical substance is adsorbed on a surface of a silicon substrate by a gaseous phase method. The adsorption of the first chemical substance is carried out by, for example, supplying a gas containing the first chemical substance onto the surface of the silicon substrate. Alternatively, it is possible to supply a gas containing a predetermined compound onto the silicon substrate surface. In this case, the compound contained in the gas is decomposed on the substrate surface so as to generate the first chemical substance.

The adsorption of the first chemical substance on the silicon substrate surface is saturated at the time when a monoatomic film, a monomolecular film or a stacked film made of a predetermined number of a monoatomic or monomolecular films is formed. Therefore, the adsorbed amount is made uniform by allowing the first chemical substance to be adsorbed until the adsorption is saturated. Incidentally, the first chemical substance adsorbed on the substrate surface forms in general a monoatomic layer or a monomolecular layer. However, it is possible for the adsorbed first chemical substance to form a layer of a laminate structure. What is important in the present invention is that the adsorption is saturated at the time when a predetermined number of monoatomic or monomolecular film is formed.

After adsorption of the first chemical substance is saturated, a silicon compound layer is formed on the substrate surface having the first chemical substance adsorbed thereon. As described above, one of the first and second chemical substances contains silicon, with the other chemical substance containing an element other than silicon. The silicon compound consists essentially of silicon contained in one of the first and second chemical substances and an element other than silicon, which is contained in the second chemical substance.

Formation of the silicon compound layer is performed by supplying a gas containing the second chemical substance onto the surface of the silicon substrate. Where the first and second chemical substances are supplied simultaneously onto the substrate surface by a gaseous phase method, the thickness of the silicon compound layer is affected by the gas flow rate, the gas supply time, etc. Also, the uniformity in thickness of the silicon compound layer is affected by the gas stream, etc.

On the other hand, where the first chemical substance is adsorbed in advance on the substrate surface and the supply of the first chemical substance is already stopped when the second chemical substance is supplied onto the substrate surface, almost all the first chemical substance involved in formation of the silicon compound layer is limited to that adsorbed on the substrate surface. Therefore, the reaction between the first and second chemical substances is stopped at the time when the first chemical substance adsorbed on the substrate surface has been consumed. It follows that, even if the second chemical substance is excessively supplied, the silicon compound layer is prevented from being formed excessively thick. In other words, the thickness of the silicon compound layer is controlled easily and at a high accuracy.

As described previously, the first chemical substance adsorbed on the substrate surface forms a monoatomic or monomolecular layer, or a multilayer structure consisting of a predetermined number of monoatomic or monomolecular layers. Therefore, it is possible to obtain a silicon compound layer as a monomolecular layer or a multilayer structure consisting of a predetermined number of monomolecular layers by allowing the reaction for forming the silicon compound to proceed to a saturated state. It follows that the method of the present invention makes it possible to control the thickness of the silicon compound layer on a molecule level. Since the thickness of the silicon compound layer is controlled on a molecule level, it is possible to form a silicon compound layer of a high flatness in a desired thickness by alternately repeating the two steps included in the method of the present invention.

In the method of the present invention, it is possible for any of the first and second chemical substances to contain silicon. However, the first chemical substance contains silicon in general, with the second chemical substance containing an element other than silicon. In this case, the first chemical substance includes, for example, silicon, compounds consisting of silicon and hydrogen such as silane (SiH$_4$) and disilane (Si$_2$H$_6$), and compounds consisting of silicon and halogen element such as SiF$_4$ and SiCl$_4$. On the other hand, the second chemical substance includes, for example, nitrogen and ammonia.

Where the first chemical substance contains silicon, it is desirable to supply the second chemical substance onto the substrate surface prior to supply of the first chemical substance onto the substrate surface so as to form a silicon compound layer. Since a silicon substrate is used in the present invention, a silicon compound can be formed by the reaction between silicon constituting the substrate surface and an element other than silicon, which is contained in the second chemical substance.

As described above, the first and second chemical substances contain silicon and an element other than silicon, respectively. Alternatively, it is possible for the second and first chemical substances to contain silicon and an element other than silicon, respectively. The chemical substance adsorbed on the substrate surface is determined appropriately in view of the kind, etc. of the chemical substance used.

Where the element other than silicon, which is contained in one of the first and second chemical substances, is nitrogen, a silicon compound layer consisting essentially of silicon nitride is formed on the substrate surface. As already pointed out, the method of the present invention makes it possible to form a silicon compound layer of a high flatness in a desired thickness. It follows that a semiconductor device of a high reliability can be manufactured by using as a gate insulating film a silicon compound layer consisting of silicon nitride, which is prepared by the method of the present invention.

After adsorption of the first chemical substance on the substrate surface and supply of the second chemical substance onto the substrate surface have been performed alternately, one of the adsorption and the supply can be performed continuously with the other being performed continuously or intermittently. Particularly, the adsorption of the first chemical substance can be performed continuously, and the supply of the second chemical substance can be performed intermittently. To be more specific, adsorption of the first chemical substance on the substrate surface and supply of the second chemical substance are performed alternately in the first step so as to form a thin silicon compound layer. Then, one of the adsorption and supply is performed continuously and the other is performed continuously or intermittently so as to form a silicon compound layer of a sufficient thickness. The initial stage of forming a silicon compound layer is highly sensitive to the surface state of the silicon substrate. In the method described above, however, adsorption of the first chemical substance and supply of the second chemical substance are carried out alternately in the initial stage of forming the silicon compound layer, making it possible to form a silicon compound layer of a high flatness. Also, since one of the adsorption and supply is carried out continuously and the other is carried out continuously or intermittently in the subsequent stage, the film-forming time can be shortened.

It is desirable to form the silicon compound layer on the substrate surface by supplying as the second chemical substance active species such as radicals and excited molecules onto the substrate surface having the first chemical substance adsorbed thereon, or by supplying the second chemical substance onto the substrate surface having the first chemical substance adsorbed thereon and heated to a predetermined temperature. The particular method makes it possible to form effectively a monomolecular layer consisting of a silicon compound (silicon compound layer) on the substrate surface. Particularly, where active species such as nitrogen radicals (nitrogen atoms) are used as the second chemical substance, a silicon compound layer can be formed without heating or cooling the substrate. It follows that, in the case of employing the particular method for forming a silicon nitride film, it is possible to suppress the difficulties accompanying the temperature elevation. Specifically, it is possible to suppress the surface roughening of the silicon substrate and the grain growth of the silicon nitride film in the initial stage of the film formation. It is also possible to suppress the stress at the interface between the silicon nitride film and the silicon substrate, the stress being caused by a rapid temperature change of the substrate. It follows that it is possible to suppress the strain, defects, etc. in the vicinity of the interface.

Where active species are used as the second chemical substance, these active species can be formed by applying a microwave discharge, an electron beam irradiation, a treatment with a platinum catalyst, etc. to, for example, a nitrogen gas. Also, where active species are used as the second chemical substance, it is desirable to supply these active species onto the substrate surface in the form of a down flow plasma. In this case, it is possible to suppress the damage done to the substrate surface.

The adsorption of the first chemical substance on the substrate surface can be performed by supplying active species as the first chemical substance onto the substrate surface. It is also possible to supply the first chemical substance onto the substrate surface which is cooled. Further, it is possible to supply a predetermined compound onto the substrate surface which is heated so as to decompose the compound to form the first chemical substance.

As described above, the first chemical substance can be effectively adsorbed on the substrate surface by several methods. Particularly, where active species such as :SiF$_2$ radicals are used as the first chemical substance, the first chemical substance can be adsorbed on the substrate surface without heating or cooling the substrate. It follows that it is possible to solve the problems accompanying the heating or cooling of the substrate, as already pointed out.

Where active species are used as the first chemical substance, it is desirable to use :SiF$_2$ radicals as the active species. In the case of using the :SiF$_2$ radicals, the hydrogen concentration in the silicon nitride layer can be lowered. Also, compared with the use of, for example, SiF$_4$, entry of fluorine into the formed film can be suppressed.

Where the first chemical substance consists of active species, or where the substrate is heated in allowing the first chemical substance to be adsorbed on the substrate surface, the first chemical substance is chemically adsorbed in general on the substrate surface. On the other hand, where the substrate is cooled in allowing the first chemical substance to be adsorbed on the substrate surface, the first chemical substance is physically adsorbed in general on the substrate surface.

In the case of using active species as the first chemical substance, these active species can be formed by applying, for example, a microwave discharge, an electron beam irradiation or a treatment with a platinum catalyst to, for example, an SiF$_4$ gas, like the active species used as the second chemical substance. Where active species are used as the first chemical substance, it is desirable to supply these active species onto the substrate surface in the form of a down flow plasma. In this case, a damage done to the substrate surface can be suppressed.

It is desirable to carry out the adsorption step of the first chemical substance and the forming step of a silicon compound layer described above while maintaining the substrate surface at a temperature of 600° C. or less, preferably at a temperature of 400° C. or less. In this case, it is possible to prevent the substrate surface from being roughened by traces of water, oxygen and organic substances contained in the atmosphere.

According to another aspect of the present invention, there is provided a film-forming apparatus, comprising a process chamber housing a target object to be processed; first gas supply means connected to the process chamber for supplying a first gas containing a first chemical substance having silicon atoms to the surface of the target object housed in the process chamber; second gas supply means connected to the process chamber for supplying a second gas containing a second chemical substance having at least one element other than silicon onto the surface of the target object housed in the process chamber; switching means connected to the first and second gas supply means for switching the gas supplied into the process chamber between the first gas and the second gas; and active species forming means for forming any one of the first and second chemical substances as active species and supplying the formed active species into any one of the first and second gas supply means.

According to still another aspect of the present invention, there is provided a film-forming apparatus, comprising a process chamber housing a target object to be processed; first gas supply means connected to the process chamber for supplying a first gas containing a first chemical substance having silicon atoms to the surface of the target object housed in the process chamber; second gas supply means connected to the process chamber for supplying a second gas containing a second chemical substance having at least one element other than silicon onto the surface of the target object housed in the process chamber; switching means connected to the first and second gas supply means for switching the gas supplied into the process chamber between the first gas and the second gas; and means arranged within the process chamber for heating or cooling the target object housed in the process chamber.

The switching means switches the gas supplied onto the surface of a target object such as a silicon substrate between the first gas and the second gas. In other words, the switching means makes it possible to supply the first and second gases alternately onto the surface of the target object. Also, it is desirable for the gas supply means to be controlled to permit one of the first and second gases to be supplied continuously and the other gas to be supplied intermittently. Particularly, it is desirable for the first gas to be supplied continuously and for the second gas to be supplied intermittently.

Like the film-forming method described previously, the film-forming apparatus of the present invention makes it possible to control the thickness of the formed film on a molecule level. Therefore, the film-forming apparatus of the present invention permits forming a silicon compound layer excellent in flatness while controlling the thickness of the silicon compound layer at a high accuracy.

Where the film-forming apparatus of the present invention is used for forming a silicon nitride film, it is desirable to use a nitride such as boron nitride as a material for forming the active species-forming means (typically, discharge tube). In the case of using, for example, a quartz tube as a discharge tube, oxygen is likely to enter the formed silicon nitride film. In the case of using a nitride such as boron nitride for forming the discharge tube, it is possible to form a silicon nitride film substantially free from impurities and low in defect density.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3G are cross sectional views schematically showing a method of forming a film according to first to fourth embodiments of the present invention;

DETAILED DESCRIPTION OF THE INVENTION

Figure 1A:
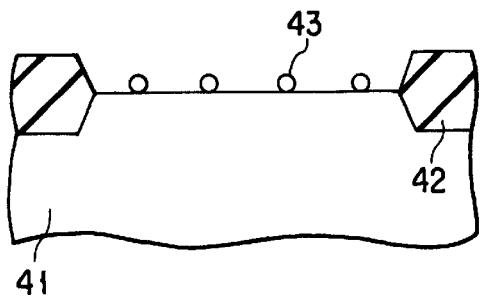
FIGS. 1A to 1D are cross sectional views collectively showing schematically a conventional method of forming a silicon nitride film.
Figure 1B:
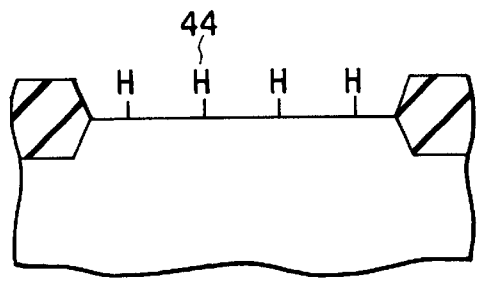
Figure 1C:
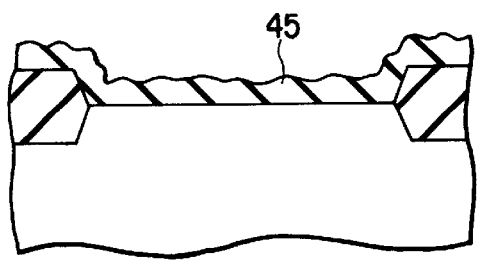
Figure 1D:
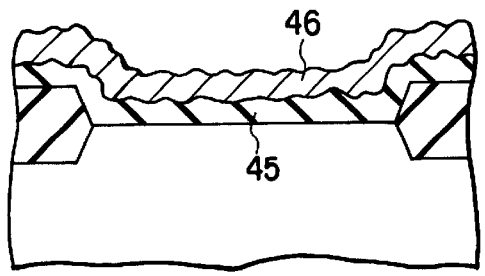
Figure 2:
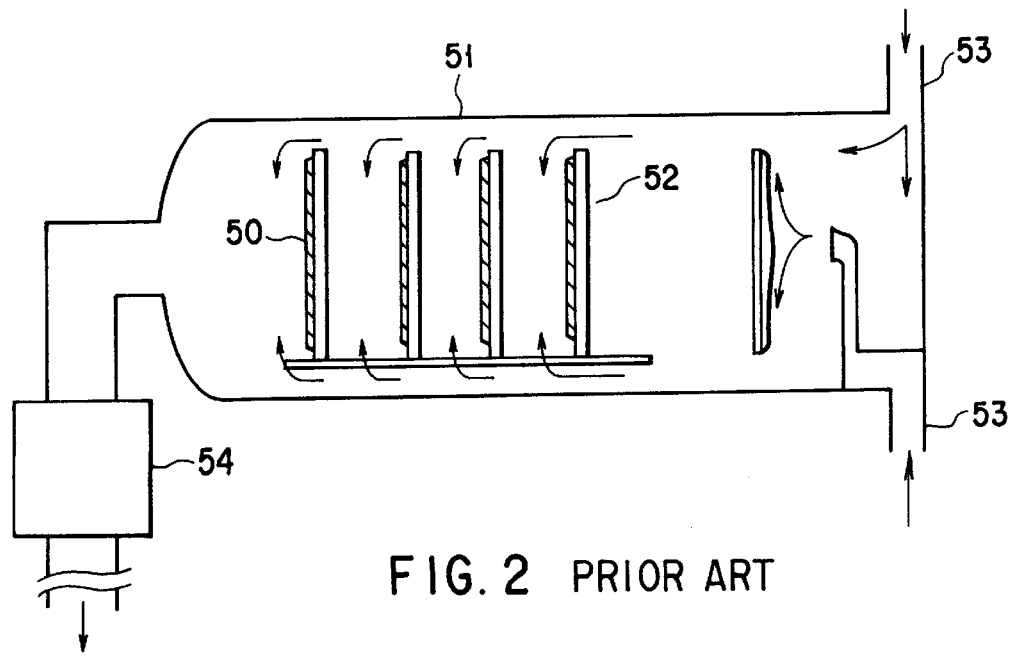
FIG. 2 schematically shows the construction of a conventional film-forming apparatus.

Let us describe the present invention more in detail with reference to the accompanying drawings.

First of all, let us describe a first embodiment of the present invention. Specifically, FIGS. 3A to 3G are cross sectional views schematically showing the film-forming method according to the first to fourth embodiments of the present invention. In working the method according to the first embodiment of the present invention, a field oxide film 2 is formed first in a thickness of 800 nm on a surface of an n-type silicon substrate 1 having a (100) plane as a main surface, as shown in FIG. 3A. Then, treatments with sulfuric acid-hydrogen peroxide ($H_2SO_4/H_2O_2$), with hydrochloric acid-hydrogen peroxide solution ($HCl/H_2O_2/H_2O$), and with a dilute hydrofluoric acid ($HF/H_2O$) are applied successively as pre-treatments to the silicon substrate 1 so as to remove organic and metallic contaminants 3 from the substrate surface. As a result, the surface of the silicon substrate 1 is terminated with hydrogen 4 (modified by hydrogen radicals, etc.), as shown in FIG. 3B.

In the next step, the silicon substrate 1 having the surface terminated with hydrogen 4 is transferred into a one-by-one type cluster CVD apparatus. Further, active species of nitrogen such as nitrogen radicals formed by applying a microwave discharge treatment to a nitrogen gas are supplied onto the surface of the silicon substrate 1 in the form of a down flow plasma. The treating conditions in this step are as follows:

Substrate temperature: Room temperature
Gas: $N_2$ (170 sccm, 1 Torr)
Discharge: 2.45 GHz, 20 W
Treating time: 30 minutes As a result, a silicon nitride film 5a, which is a monomolecular film, is formed on the surface of the silicon substrate 1, as shown in FIG. 3C. The nitriding reaction is saturated at the time when the silicon nitride film 5a is formed in the form of a monomolecular film.

Then, a silane gas is supplied while cooling the substrate so as to allow the silane molecules to be physically adsorbed on the surface of the silicon nitride film 5a. The treating conditions in this step are as follows:

Substrate temperature: $-80°$ C.
Gas: $SiH_4$ (20 sccm, 0.3 Torr)
Treating time: 30 minutes As a result, silane molecules are uniformly adsorbed physically to form a monomolecular film, as shown in FIG. 3D.

In the next step, the adsorbed silane molecules are nitrided by supplying active species of nitrogen such as nitrogen radicals onto the substrate surface having the silane molecules 6 adsorbed thereon. As a result, a second silicon nitride film 5b is formed as a monomolecular film on the first silicon nitride film 5a, as shown in FIG. 3E. The nitriding reaction is saturated at the time when the silicon nitride film 5b is formed as a monomolecular film.

The adsorption of the silane molecules and nitridation with active species of nitrogen are repeated several times to form a silicon nitride film 5 having a thickness of about 6 nm, as shown in FIG. 3F. After formation of the silicon nitride film 5, a polycrystalline silicon film 7 is formed by using a silane gas, as shown in FIG. 3G. Finally, the silicon substrate is taken out of the process chamber.

Figure 4A:
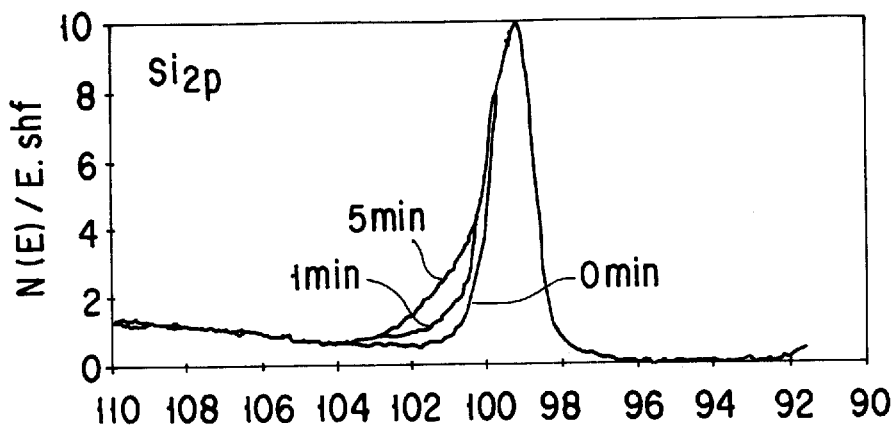
FIGS. 4A to 4C and FIG. 5 are graphs each showing the changes with time in the $Si_{2p}$ spectrum in the film-forming method according to the first embodiment of the present invention.
Figure 4B:
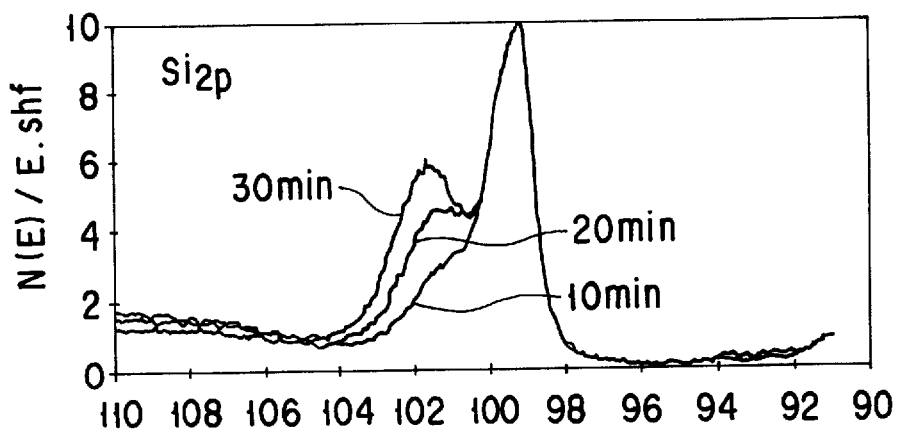
Figure 4C:
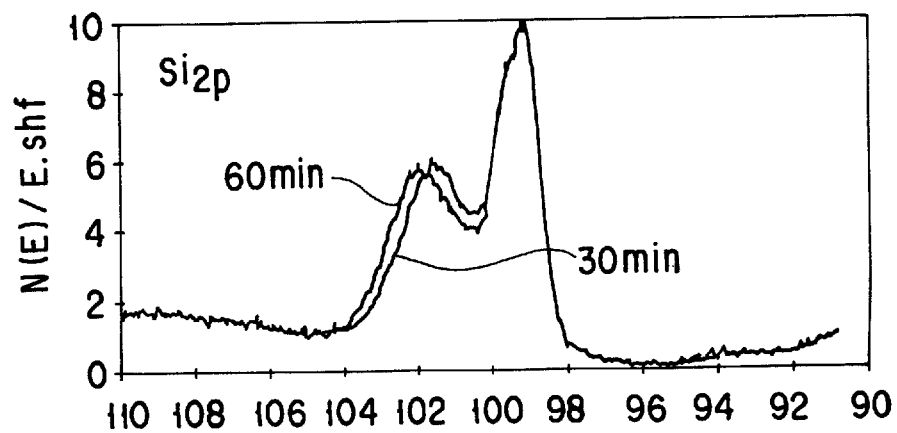
Figure 5:
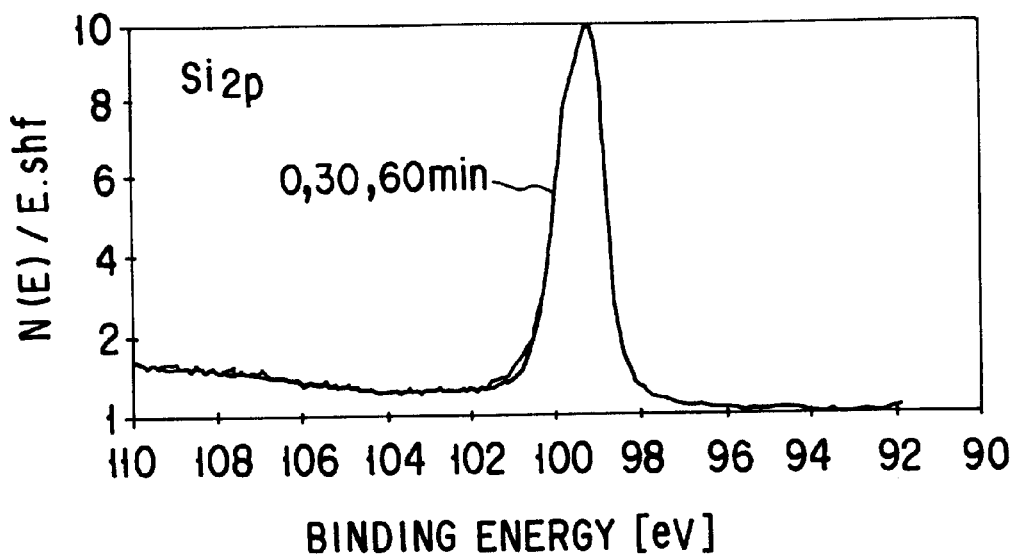

The change in the bond state of the silicon substrate surface terminated with hydrogen, said change being caused by supply of active species of nitrogen, was measured by an X-ray photoelectron spectroscopy (XPS). In measuring the change, Mg—Ka was used as an X-ray source, the X-ray incident angle on the silicon substrate surface was set at 45°, and the photoelectron measuring angle was set at 15°. FIGS. 4A to 4C and FIG. 5 are graphs showing the results in respect of the change with time in the $Si_{2p}$ spectrum. To be more specific, FIGS. 4A to 4C show the changes in the spectrum, covering the case where the silicon nitride film was formed by the method described previously with reference to FIG. 3C. On the other hand, FIG. 5 shows the change in the spectrum, covering a case where a nitrogen gas flow was employed in place of using active species of nitrogen.

As apparent from FIGS. 4A to 4C, the peak appearing within a range of 101 to 102 eV of binding energy, i.e., the peak area of the silicon nitride film, is increased with time.

The increase is saturated in about 30 minutes and, then, the peak is shifted toward a higher energy side. On the other hand, FIG. 5 shows that the spectrum is scarcely changed even 60 minutes later in the case of using a nitrogen gas flow without using active species of nitrogen.

Figure 6:
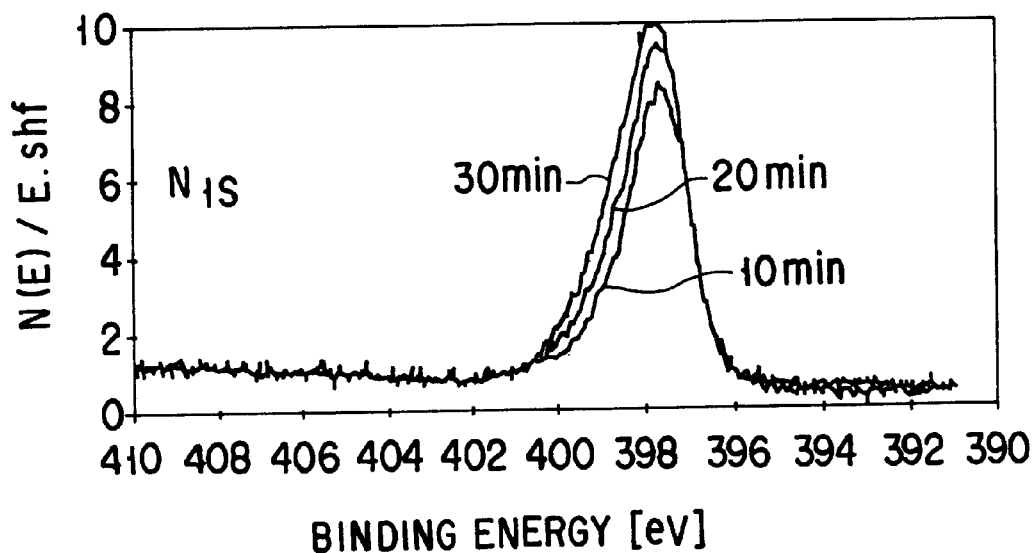
FIG. 6 is a graph showing the change with time in the $N_{1s}$ spectrum, covering the case where a silicon nitride film was formed by the film-forming method according to the first embodiment of the present invention.

FIG. 6 is a graph showing the change with time in the $N_1S$ spectrum, covering the case where a silicon nitride film was formed by using active species of nitrogen by the method described with reference to FIG. 3C. As apparent from the graph, the peak area is increased with time in the case of using active species of nitrogen.

Figure 7:
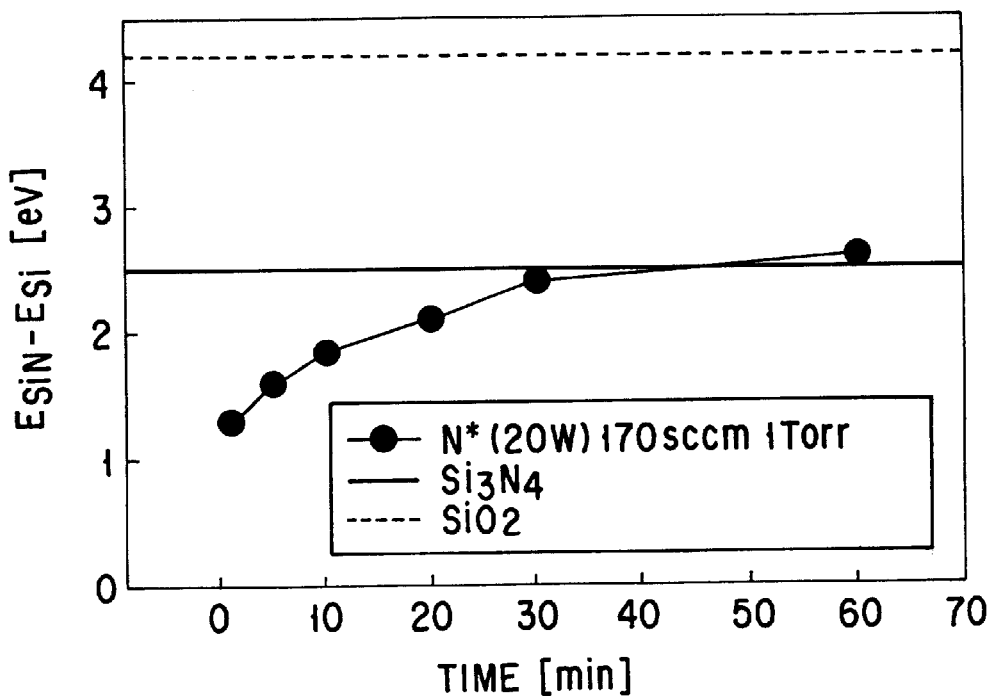
FIG. 7 is a graph showing the amount of chemical shift in respect of $Si_{2p}$ of a silicon nitride film calculated from the data shown in FIGS. 4A to 4C.

FIG. 7 is a graph showing the amount of chemical shift ($E_{SiN}$—$E_{Si}$) in respect of $Si_{2p}$ of the silicon nitride, which is obtained from the data shown in FIGS. 4A to 4C. Incidentally, $E_{Si}$ represents a peak position of the spectrum concerning the silicon substrate, with $E_{SiN}$ representing a peak position of the spectrum concerning the silicon nitride film. As apparent from FIG. 7, the bond state of the silicon nitride film formed by the method described with reference to FIGS. 3A to 3G approaches the bond state of a bulk silicon nitride with time. Also, the final bond state is considered to be substantially equal to the bond state of the bulk silicon nitride.

The experimental data given in FIG. 7 support that the method according to the first embodiment of the present invention permits forming a silicon nitride film having a stable bond state (bond state of bulk silicon nitride), though a low temperature process is employed in this embodiment.

Figure 8:
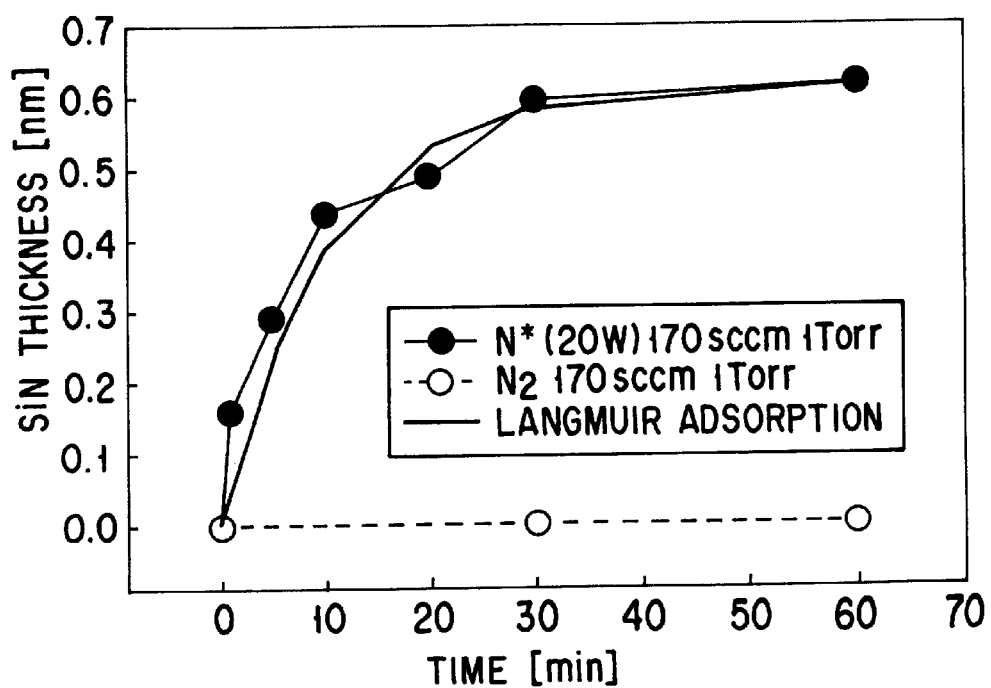
FIG. 8 is a graph showing the change with time in the thickness of a silicon nitride film calculated from the data shown in FIGS. 4A to 4C.

FIG. 8 is a graph showing the change with time in the thickness of a silicon nitride film. The black dots in the graph cover the case where a silicon nitride film was formed by using active species of nitrogen, with the white dot covering the case where a silicon nitride film was formed under a nitrogen gas flow without using active species of nitrogen. As apparent from FIG. 8, the film thickness reached saturation in about 30 minutes in the case of using active species of nitrogen.

The thickness d (nm) of the silicon nitride film was calculated by using a formula given below based on the chemically shifted $Si_{2p}$ spectrum intensity $I_{SiN}$ and the $Si_{2p}$ spectrum intensity $I_{Si}$ from the silicon substrate:

$$d = \lambda \sin\theta \times \ln\{k(I_{SiN}/I_{Si})+1\}$$

where $\lambda$ denotes an escape depth of photoelectron with regard to the silicon nitride film, which is about 2.6 nm, and k is a value determined from the silicon nitride film density, etc., which is 1.47.

Nitridation takes place uniformly on the silicon substrate surface terminated with hydrogen. This is made clearer by comparison with a theoretical value calculated from a theoretical formula given below. Specifically, where nitrogen atoms are assumed to be adsorbed at random, i.e., Langmuir adsorption, the change with time in coverage $\theta$ is represented by:

$$d\theta/dt = k(1-\theta)$$

where k is a constant.

The formula given above is on the assumption that there is no interaction among the adsorbed nitrogen atoms, and that the adsorption rate is proportional to the non-adsorbed area. From the above formula, the coverage $\theta(t)$ is represented by:

$$\theta(t) = \theta_0(1-e^{-kt})$$

where $\theta_0$ denotes a saturated coverage. If active species of nitrogen are actually adsorbed to follow the Langmuir adsorption, the silicon nitride film thickness d(t) obtained by the XPS measurement must exhibit a Langmuir-wise change like $\theta(t)$. The change in the film thickness calculated under the assumption of the Langmuir adsorption is also depicted in FIG. 8 together with the change in the film thickness calculated from the measured values. As apparent from FIG. 8, the two curves depicted in FIG. 8 are very close to each other. In other words, it has been clarified that the active species of nitrogen are adsorbed at random on the hydrogen-terminated (100) plane of the silicon substrate.

The method according to the first embodiment of the present invention was compared with the conventional high temperature nitriding process, as follows. It should be noted that, in the high temperature nitriding process of a silicon substrate surface using an ammonia gas, $NH_x$ (x is an integer of 0 to 2) generated by thermal decomposition of $NH_3$ is considered to be diffused into a silicon nitride film so as to carry out reaction with an unreacted silicon and, thus, to bring about an increase in the thickness of the silicon nitride film. The thickness $X_n$ of the silicon nitride film and the treating time in the high temperature nitriding process are known to meet the relationship given below (M. Moslehi et al., IEEE Trans. Electronic Device, vol. ED-32, no. 2, p106 (1985) and A. Reisman et al., J. Electronic Materials, Vol. 13, no. 3, p505 (1984)):

$$X_n = a \times \exp(-E/kT) \times t^{0.2}$$

where a and k are constants, E is an activating energy, t is a nitriding treating time.

The change with time in the thickness of the silicon nitride film was calculated by using the above formula. In this calculation, a was set at 920.2, and E was set at 0.38 eV.

Figure 9:
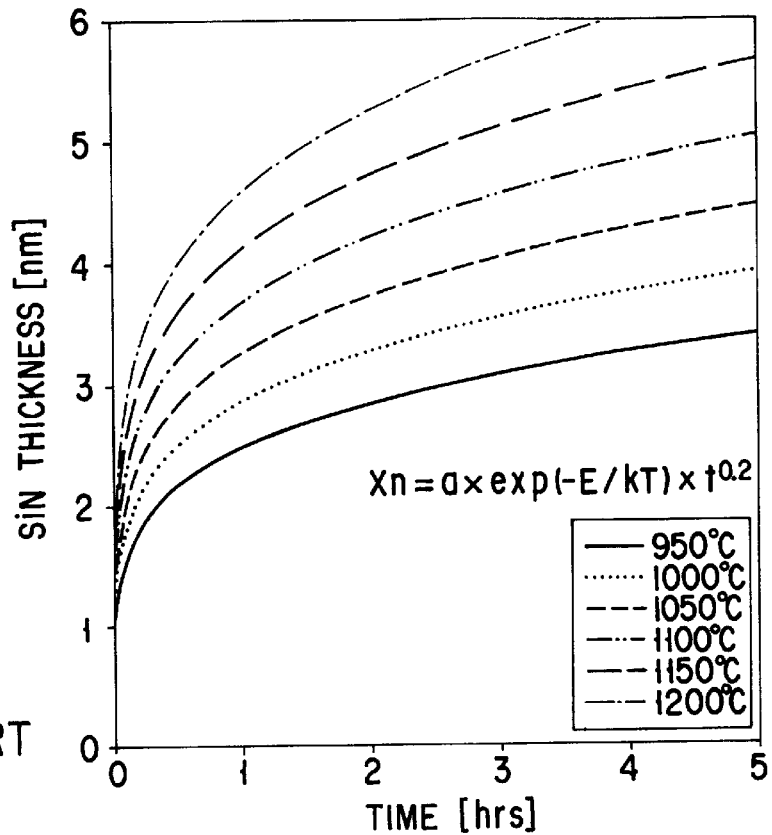
FIG. 9 is a graph showing the change with time in the thickness of a silicon nitride film formed by the conventional nitriding process under high temperatures.

FIG. 9 is a graph showing the change with time in the thickness of the silicon nitride film, covering the case where a silicon substrate surface was subjected to a high temperature nitriding process using an ammonia gas. As apparent from the graph, the thickness of the silicon nitride film is moderately increased with time in the high temperature nitriding process.

Figure 10:
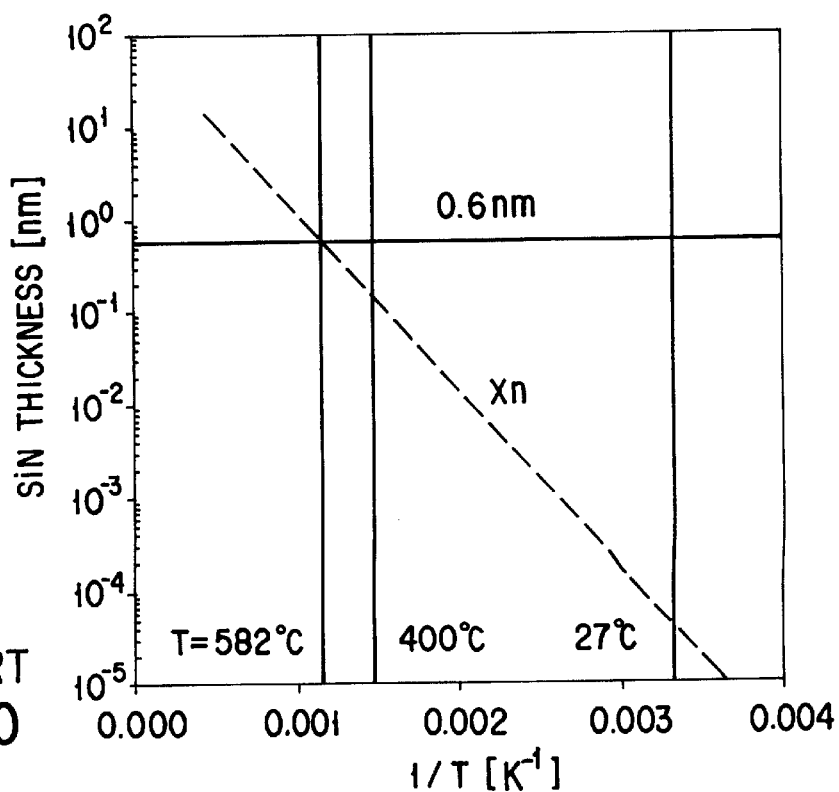
FIG. 10 is a graph showing the relationship between the thickness of a silicon nitride film and temperature obtained from the data shown in FIG. 9.

FIG. 10 is a graph showing the relationship between the thickness of a silicon nitride film and temperature at the nitriding treating time t of 2 hours.

In the case of employing the method according to the first embodiment of the present invention, a silicon nitride film having a thickness of 0.6 nm can be formed at a high accuracy as already described with reference to FIG. 8. On the other hand, in order to form a silicon nitride film having a thickness of 0.6 nm by the high temperature nitriding process, it is necessary to control the temperature at 582° C. or less, as shown in FIG. 10. Also, according to the high temperature nitriding process, it is necessary to liberate the hydrogen terminating the silicon substrate surface prior to the reaction between the silicon substrate surface and ammonia. However, the substrate must be heated to temperatures exceeding 400° C. in order to liberate the hydrogen. What should be noted is that, in order to form a silicon nitride film having a thickness of 0.6 nm by the high temperature nitriding process, it is necessary to control the temperature within a narrow range, i.e., to exceed 400° C. and not to exceed 582° C. Further, where the temperature is set at 582° C., the nitriding treating time is limited to 2 hours.

On the other hand, the reaction given below takes place on the silicon substrate surface in the method according to the first embodiment of the present invention:

Si—H+N*→Si—N—H

As seen from the reaction formula given above, nitrogen atoms are adsorbed on the silicon substrate surface by the insertion reaction of nitrogen radicals into the Si—H bond in the method according to the first embodiment of the present invention. Naturally, the substrate need not be heated to temperatures exceeding 400° C. in the first embodiment of the present invention. Also, since the nitrogen radicals are inserted into the Si—H bond which is present only in the surface region of the substrate, the nitrogen atoms are not diffused deep into the silicon substrate even if the nitriding treating time is excessively long. In other words, the thickness of the silicon nitride film is saturated. It follows that the method according to the first embodiment of the present invention can be worked under low temperatures not exceeding 400° C. In addition, a silicon nitride film of a predetermined thickness can be formed without relying on the nitriding treating time.

As described above, according to the first embodiment of the present invention, a silicon nitride film having a bond state equal to that observed in the thermal nitriding process can be formed at a high flatness, though the process is carried out at low temperatures. Also, once a nitride film of a monomolecular layer structure is formed on a silicon substrate, the nitriding reaction does not proceed further even if active species are further supplied, making it possible to control the film thickness at a high accuracy.

Figure 11:
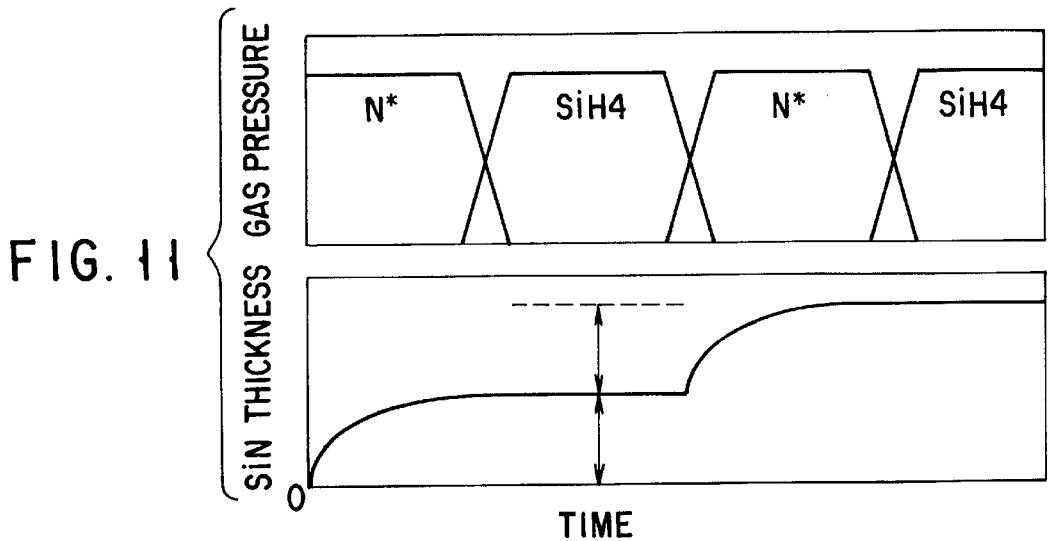
FIG. 11 is a graph schematically showing the gas supply sequence and the change with time in the thickness of the silicon nitride film in film-forming method according to the first embodiment of the present invention.

FIG. 11 shows a gas supply sequence employed in the first embodiment of the present invention and the change with time in the thickness of the silicon nitride film. It should be noted that the thickness of the silicon nitride film can be controlled on a molecule level by carrying out alternately and repeatedly the nitriding reaction using active species of nitrogen and the adsorption of silane. It is also possible to form a silicon nitride film having a thickness of 3 nm or more by increasing the number of repetitions, though such a thick silicon nitride film cannot be formed by the thermal nitriding process.

Let us describe the second embodiment of the present invention with reference to FIGS. 3A to 3G. In the first step, a field oxide film 2 is formed first in a thickness of 800 nm on a surface of an n-type silicon substrate 1 having a (100) plane as a main surface, as shown in FIG. 3A. Then, treatments with sulfuric acid-hydrogen peroxide ($H_2SO_4$/$H_2O_2$), with hydrochloric acid-hydrogen peroxide solution ($HCl$/$H_2O_2$/$H_2O$), and with a dilute hydrofluoric acid ($HF$/$H_2O$) are applied successively as pre-treatments to the silicon substrate 1 so as to remove organic and metallic contaminants 3 from the substrate surface. As a result, the surface of the silicon substrate 1 is terminated with hydrogen 4, as shown in FIG. 3B.

In the next step, the silicon substrate 1 having the surface terminated with hydrogen 4 is transferred into a one-by-one type cluster CVD apparatus. Further, active species of nitrogen formed by applying a microwave discharge treatment to a nitrogen gas are supplied onto the surface of the silicon substrate 1 in the form of a down flow plasma. The treating conditions in this step are as follows:

Substrate temperature: Room temperature
Gas: $N_2$ (170 sccm, 1 Torr)
Discharge: 2.45 GHz, 20 W
Treating time: 30 minutes As a result, a silicon nitride film 5a, which is a monomolecular film, is formed on the surface of the silicon substrate 1, as shown in FIG. 3C. The nitriding reaction is saturated at the time when the silicon nitride film 5a is formed in the form of a monomolecular film.

Then, silicon atoms 6 are chemically adsorbed on the surface of the silicon nitride film 5a as shown in FIG. 3D with a down flow plasma generated by applying a microwave discharge treatment to a silane gas. The treating conditions in this step are as follows:

Substrate temperature: room temperature
Gas: $SiH_4$ (20 sccm, 0.3 Torr)
Discharge: 2.45 GHz, 20 W
Treating time: 30 minutes As a result, the silicon atoms 6 are chemically adsorbed uniformly on the silicon nitride film 5a to form an amorphous silicon layer having a monoatomic layer structure.

Then, active species of nitrogen are supplied onto the substrate surface having the silicon atoms 6 adsorbed thereon so as to nitride the adsorbed silicon atoms 6. As a result, a second silicon nitride film 5b is formed in the form of a monomolecular film on the first silicon nitride film 5a, as shown in FIG. 5E. The nitriding reaction is saturated at the time when the silicon nitride film 5b of the monomolecular layer structure is formed.

The silicon adsorption and the nitridation of the adsorbed silicon with active species of nitrogen are carried out repeatedly a plurality of times so as to form a silicon nitride film 5 having a thickness of about 6 nm, as shown in FIG. 3F. Further, a polycrystalline silicon film 7 is formed by using a silane gas on the silicon nitride film 5, as shown in FIG. 3G, followed by taking the silicon substrate out of the process chamber.

Like the first embodiment, the second embodiment also makes it possible to form a uniform silicon nitride film of a high flatness. Also, unlike the first embodiment, silicon atoms are adsorbed on the first silicon nitride film at room temperature in the second embodiment. In other words, the silicon substrate need not be cooled in the second embodiment in the step of adsorbing the silicon atoms on the first silicon nitride film.

Let us describe the third embodiment of the present invention with reference to FIGS. 3A to 3G. In the first step, a field oxide film 2 is formed first in a thickness of 800 nm on a surface of an n-type silicon substrate 1 having a (100) plane as a main surface, as shown in FIG. 3A. Then, treatments with sulfuric acid-hydrogen peroxide ($H_2SO_4$/$H_2O_2$), with hydrochloric acid-hydrogen peroxide solution ($HCl$/$H_2O_2$/$H_2O$), and with a dilute hydrofluoric acid ($HF$/$H_2O$) are applied successively as pre-treatments to the silicon substrate 1 so as to remove organic and metallic contaminants 3 from the substrate surface. As a result, the surface of the silicon substrate 1 is terminated with hydrogen 4, as shown in FIG. 3B.

In the next step, the silicon substrate 1 having the surface terminated with hydrogen 4 is transferred into a one-by-one type cluster CVD apparatus. Further, active species of nitrogen formed by applying a microwave discharge treatment to a nitrogen gas are supplied onto the surface of the silicon substrate 1 in the form of a down flow plasma. The treating conditions in this step are as follows:

Substrate temperature: Room temperature
Gas: $N_2$ (170 sccm, 1 Torr)
Discharge: 2.45 GHz, 20 W
Treating time: 30 minutes As a result, a silicon nitride film 5a, which is a monomolecular film, is formed on the surface of the silicon substrate 1, as shown in FIG. 3C. The nitriding reaction is saturated at the time when the silicon nitride film 5a is formed in the form of a monomolecular film.

Then, a disilane gas is supplied onto the surface of the silicon nitride film 5a while heating the substrate so as to allow silicon atoms 6 to be adsorbed on the surface of the silicon nitride film 5a, as shown in FIG. 3D. The treating conditions in this step are as follows:

Substrate temperature: 500° C.

Gas: $Si_2H_6$ (20 sccm, 0.3 Torr)

Treating time: 30 minutes

As a result, silicon atoms 6 are uniformly adsorbed chemically to form an amorphous silicon film in the form of a monoatomic film, as shown in FIG. 3D.

Then, active species of nitrogen are supplied onto the substrate surface having the silicon atoms 6 adsorbed thereon so as to nitride the adsorbed silicon atoms 6. As a result, a second silicon nitride film 5b is formed in the form of a monomolecular film on the first silicon nitride film 5a, as shown in FIG. 5E. The nitriding reaction is saturated at the time when the silicon nitride film 5b of the monomolecular layer structure is formed.

The silicon adsorption and the nitridation of the adsorbed silicon with active species of nitrogen are carried out repeatedly a plurality of times so as to form a silicon nitride film 5 having a thickness of about 6 nm, as shown in FIG. 3F. Further, a polycrystalline silicon film 7 is formed by using a silane gas on the silicon nitride film 5, as shown in FIG. 3G, followed by taking the silicon substrate out of the process chamber.

Like the first and second embodiments, the third embodiment also makes it possible to form a uniform silicon nitride film of a high flatness. Also, according to the third embodiment, the silicon adsorption can be performed under temperatures at which the silicon substrate is not roughened and without using a special discharge mechanism, unlike the first and second embodiments.

Let us describe the fourth embodiment of the present invention with reference to FIGS. 3A to 3G. In the first step, a field oxide film 2 is formed first in a thickness of 800 nm on a surface of an n-type silicon substrate 1 having a (100) plane as a main surface, as shown in FIG. 3A. Then, treatments with sulfuric acid-hydrogen peroxide ($H_2SO_4$/$H_2O_2$), with hydrochloric acid-hydrogen peroxide solution (HCl/$H_2O_2$/$H_2O$), and with a dilute hydrofluoric acid (HF/$H_2O$) are applied successively as pre-treatments to the silicon substrate 1 so as to remove organic and metallic contaminants 3 from the substrate surface. As a result, the surface of the silicon substrate 1 is terminated with hydrogen 4, as shown in FIG. 3B.

In the next step, the silicon substrate 1 having the surface terminated with hydrogen 4 is transferred into a one-by-one type cluster CVD apparatus. Further, active species of nitrogen formed by applying a microwave discharge treatment to a nitrogen gas are supplied onto the surface of the silicon substrate 1 in the form of a down flow plasma. The treating conditions in this step are as follows:

Substrate temperature: Room temperature

Gas: $N_2$ (170 sccm, 1 Torr)

Discharge: 2.4 GHz, 20 W

Treating time: 30 minutes

As a result, a silicon nitride film 5a, which is a monomolecular film, is formed on the surface of the silicon substrate 1, as shown in FIG. 3C. The nitriding reaction is saturated at the time when the silicon nitride film 5a is formed in the form of a monomolecular film.

Then, gaseous :$SiF_2$ radicals are supplied onto the substrate surface to permit :$SiF_2$ radicals 6 to be chemically adsorbed on the surface of the silicon nitride film 5a, as shown in FIG. 3D. The :$SiF_2$ radicals can be formed by, for example, bringing an $SiF_4$ gas into contact with silicon particles heated to, for example, 1150° C. The treating conditions in this step are as follows:

Substrate temperature: 600° C.

Gas: $SiF_4$ (20 sccm, 0.3 Torr)

Treating time: 30 minutes

As a result, the :$SiF_2$ radicals are uniformly adsorbed chemically on the surface of the silicon nitride film 5a to form an $SiF_2$ film having a monomolecular layer structure, as shown in FIG. 3D.

In the next step, nitrogen radicals are supplied onto the substrate surface having the $SiF_2$ film formed thereon so as to nitride the $SiF_2$ film. As a result, a second silicon nitride film 5b having a monomolecular layer structure is formed on the first silicon nitride film 5a, as shown in FIG. 3E. The nitriding reaction is saturated at the time when the silicon nitride film 5b having a monomolecular layer structure is formed.

The adsorption of the :$SiF_2$ radicals and the nitriding reaction with nitrogen radicals are carried out repeatedly a plurality of times so as to form a silicon nitride film 5 having a thickness of about 6 nm, as shown in FIG. 3F. Further, a polycrystalline silicon film 7 is formed by using a silane gas on the silicon nitride film 5, as shown in FIG. 3G, followed by taking the silicon substrate out of the process chamber.

Like the first to third embodiments, the fourth embodiment also makes it possible to form a uniform silicon nitride film of a high flatness. Also, :$SiF_2$ radicals are used in the fourth embodiment so as to make it possible to prevent hydrogen from entering the silicon nitride film 5, though hydrogen tends to enter the silicon nitride film 5 in the embodiments using $SiH_4$ or the like. Further, the entry of fluorine into the silicon nitride film 5 can be suppressed in the fourth embodiment, compared with the other embodiments using $SiF_4$.

In the fourth embodiment, the polycrystalline silicon film 7 can be formed by using the :$SiF_2$ radicals. In this case, a diffusion of hydrogen from the polycrystalline silicon film 7 into the silicon nitride film 5 can be suppressed.

Further, let us describe a fifth embodiment of the present invention. Specifically, FIGS. 12A to 12F are cross sectional views schematically showing a film-forming method according to the fifth embodiment of the present invention.

Figure 12A:
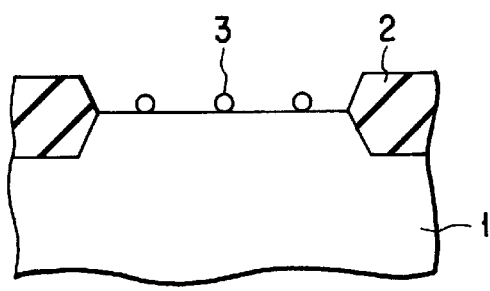
FIGS. 12A to 12F are cross sectional views schematically showing the film-forming method according to a fifth embodiment of the present invention.
Figure 12B:
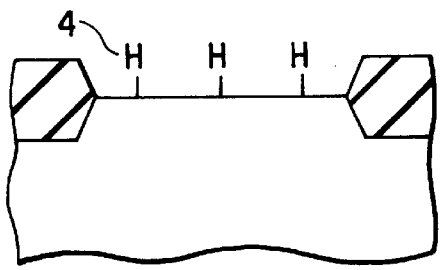

In the first step, a field oxide film 2 is formed first in a thickness of 800 nm on a surface of an n-type silicon substrate 1 having a (100) plane as a main surface, as shown in FIG. 12A. Then, treatments with sulfuric acid-hydrogen peroxide ($H_2SO_4$/$H_2O_2$), with hydrochloric acid-hydrogen peroxide solution (HCl/$H_2O_2$/$H_2O$), and with a dilute hydrofluoric acid (HF/$H_2O$) are applied successively as pre-treatments to the silicon substrate 1 so as to remove organic and metallic contaminants 3 from the substrate surface. As a result, the surface of the silicon substrate 1 is terminated with hydrogen 4, as shown in FIG. 12B.

In the next step, the silicon substrate 1 having the surface terminated with hydrogen 4 is transferred into a one-by-one type cluster CVD apparatus. Further, active species of nitrogen formed by applying a microwave discharge treatment to a nitrogen gas are supplied onto the surface of the silicon substrate 1 in the form of a down flow plasma. The treating conditions in this step are as follows:

Substrate temperature: Room temperature

Gas: $N_2$ (170 sccm, 1 Torr)

Discharge: 2.4 GHz, 20 W

Treating time: 30 minutes

Figure 12C:
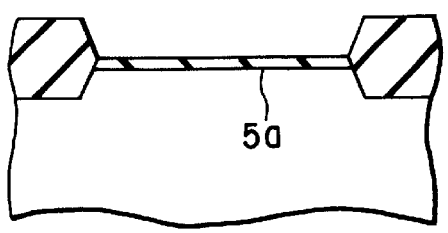

As a result, a silicon nitride film 5a, which is a monomolecular film, is formed on the surface of the silicon substrate 1, as shown in FIG. 12C. The nitriding reaction is saturated at the time when the silicon nitride film 5a is formed in the form of a monomolecular film.

Figure 12D:
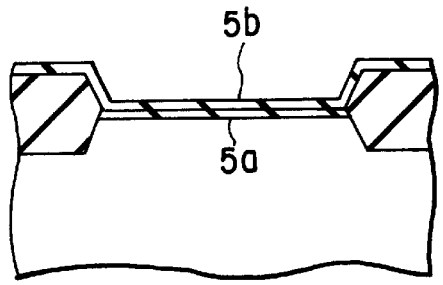
Figure 12E:
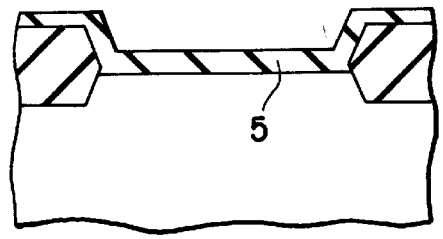

Then, active species of nitrogen and a silane gas are supplied simultaneously onto the substrate surface. The treating conditions in this step are as follows:

Substrate temperature: room temperature
Gas: $SiH_4/N_2$ (20/170 sccm, 1.1 Torr)
Discharge: 2.45 GHz, 20 W (performed to $N_2$ gas alone)
Treating time: 30 minutes As a result, a silicon nitride film 5b is formed on the silicon nitride film 5a, as shown in FIG. 12D. Deposition of the silicon nitride film 5b is continued until a silicon nitride film 5 consisting of the silicon nitride films 5a and 5b grows to have a thickness of about 6 nm, as shown in FIG. 12E.

Figure 12F:
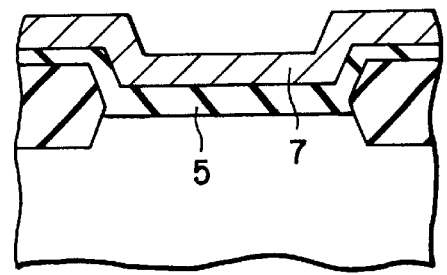

Further, a polycrystalline silicon film 7 is formed by using a silane gas on the silicon nitride film 5, as shown in FIG. 12F, followed by taking the silicon substrate out of the process chamber.

Figure 13:
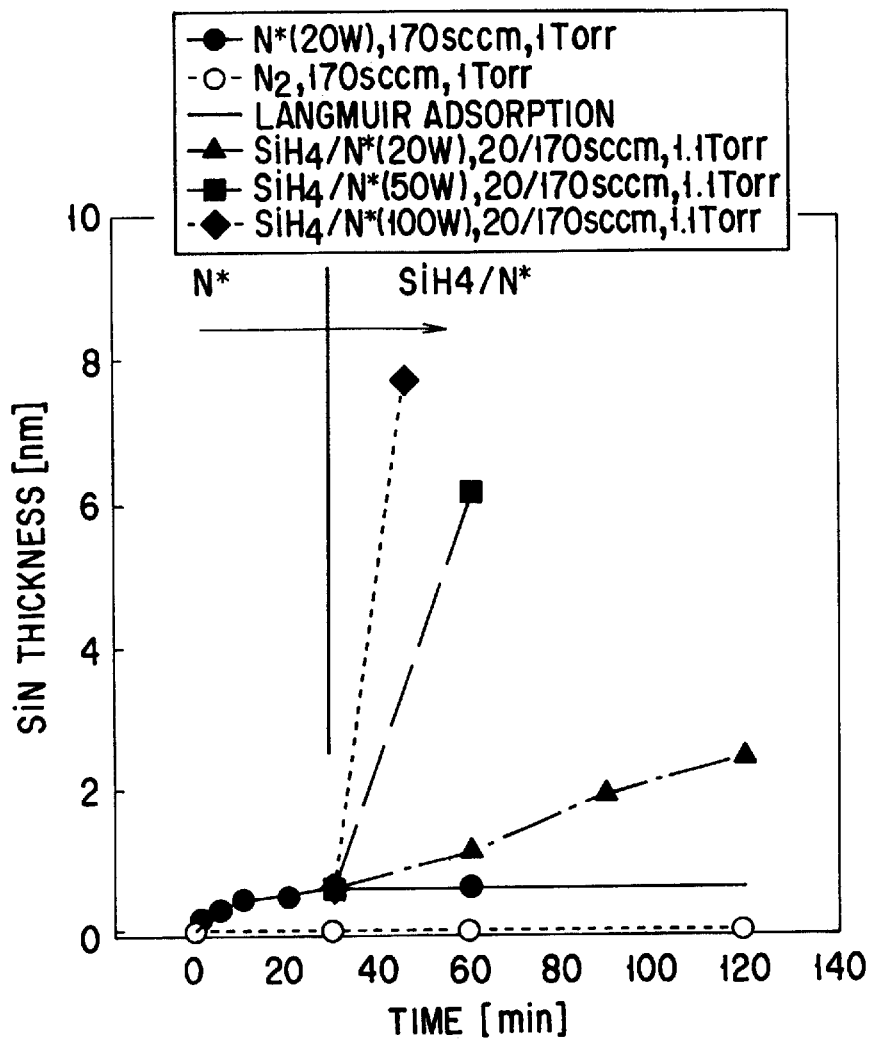
FIG. 13 is a graph showing the change with time in the thickness of a silicon nitride film obtained in the case of employing the film-forming method according to the fifth embodiment of the present invention.

The change with time in the thickness of the silicon nitride film 5 was measured during the growth of the silicon nitride film 5 by changing in various fashions the microwave power, with the results as shown in a graph of FIG. 13. The black dots shown in the graph covers the case where nitrogen radicals alone were supplied, with white dots covering the case where a nitrogen gas flow alone was performed during the growth of the silicon nitride film.

As described previously, the formation of the silicon nitride film is generally affected greatly in the initial stage by the surface state of the substrate. In the fifth embodiment of the present invention, a silicon nitride film is formed as a monomolecular film in the initial stage by supplying active species of nitrogen. Since the monomolecular film is flat and uniform, the silicon nitride film 5b formed on the monomolecular silicon nitride film can also be formed flat and uniform. Also, where a silane gas and active species of nitrogen are supplied simultaneously, the silicon nitride film 5b can be formed at a higher rate. It follows that the fifth embodiment of the present invention permits forming the silicon nitride film 5b rapidly and at a higher flatness and uniformity, compared with the conventional process.

The forming rate of the silicon nitride film Sb can be controlled by controlling the power of the microwave used for forming the active species of nitrogen (nitrogen radicals).

Figure 14:
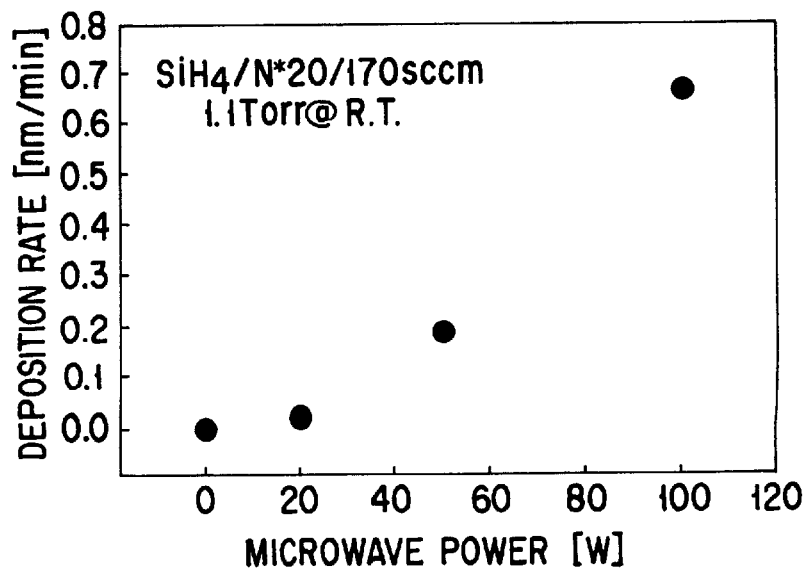
FIG. 14 is a graph showing the relationship between the power of microwave and a film-forming rate obtained from the data shown in FIG. 13.

FIG. 14 is a graph showing the relationship between the power of the microwave and the film-forming rate. As apparent from the graph, the film-forming rate is positively proportional to the microwave power.

The graph also shows that the film-forming rate can be varied within a range of 0.021 to 0.67 nm/min by varying the microwave power within a range of 20 to 100 W.

The data shown in FIG. 14 are those obtained under the same conditions in respect of the flow rate ratio and temperature. Therefore, the increase in the amount of the nitrogen active species (nitrogen radicals) is equal to the increase in the power of the microwave.

It follows that the film-forming rate of the silicon nitride film 5b can be controlled by controlling the supply amount of the nitrogen active species (nitrogen radicals).

In the fifth embodiment described above, a monomolecular layer of a silicon compound is formed by nitriding the substrate surface before the simultaneous supply of active species of nitrogen and silane gas. However, a plurality of monomolecular layers are formed in a stacked fashion in general before the simultaneous supply of the active species of nitrogen and silane gas. The method described previously in conjunction with the first to fourth embodiments can be used for forming a plurality of stacked monomolecular layers.

As described above, the fifth embodiment of the present invention makes it possible to form a silicon nitride film superior in flatness and uniformity to that obtained by the conventional method. Also, fifth embodiment differs from the first to fourth embodiments in that the active species of nitrogen and silane gas are supplied simultaneously after formation of a monomolecular silicon nitride film. It follows that the fifth embodiment permits forming a silicon nitride film at a higher film-forming rate.

As described above, the nitriding process and the adsorption process are separate from each other in the film-forming method according to any of the first to fifth embodiments of the present invention. Therefore, even if the supply amount of the active species of nitrogen is insufficient, it is possible to carry out the adsorption process after confirming that a monomolecular layer consisting of silicon nitride is formed. It follows that it is possible to form each monomolecular layer with a high uniformity within a plane and to control the film thickness on the molecule level.

It should also be noted that the active species of nitrogen are supplied onto the substrate surface in the form of a down flow plasma, making it possible to suppress markedly the damage done to the substrate, etc. Also, since the nitriding process and the adsorption process are switched under a reduced pressure, an additional effect can be obtained. Specifically, in the case of using, for example, silane, it is possible to discharge effectively hydrogen generated by the nitriding the adsorbed silane, making it possible to lower the hydrogen concentration in the silicon nitride film. Further, the film-formation can be performed under a low temperature, making it possible to prevent roughening of the silicon substrate surface, which takes place in the case of employing a high temperature process. As a result, it is possible to suppress the grain growth of the silicon nitride film in the initial stage of the film formation. What should also be noted is that a rapid change in the substrate temperature can be suppressed in the method of the present invention, making it possible to suppress the stress occurring at the interface between the silicon nitride film and the silicon substrate. It follows that it is possible to suppress strains, defects, etc. in the vicinity of the interface.

Figure 15:
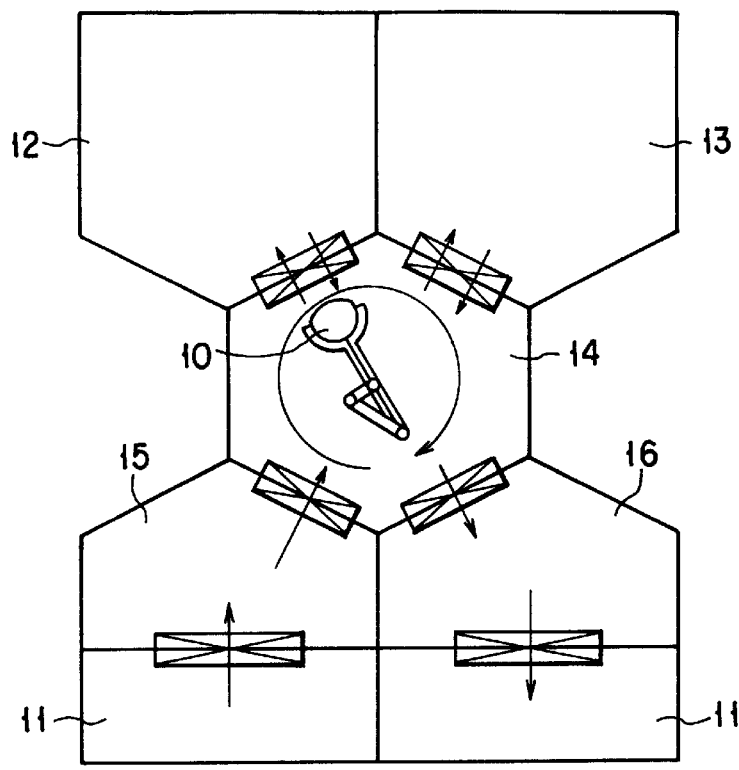
FIG. 15 is a plan view schematically showing the construction of a film-forming apparatus used in the film-forming method according to the first to fifth embodiments of the present invention.
Figure 16:
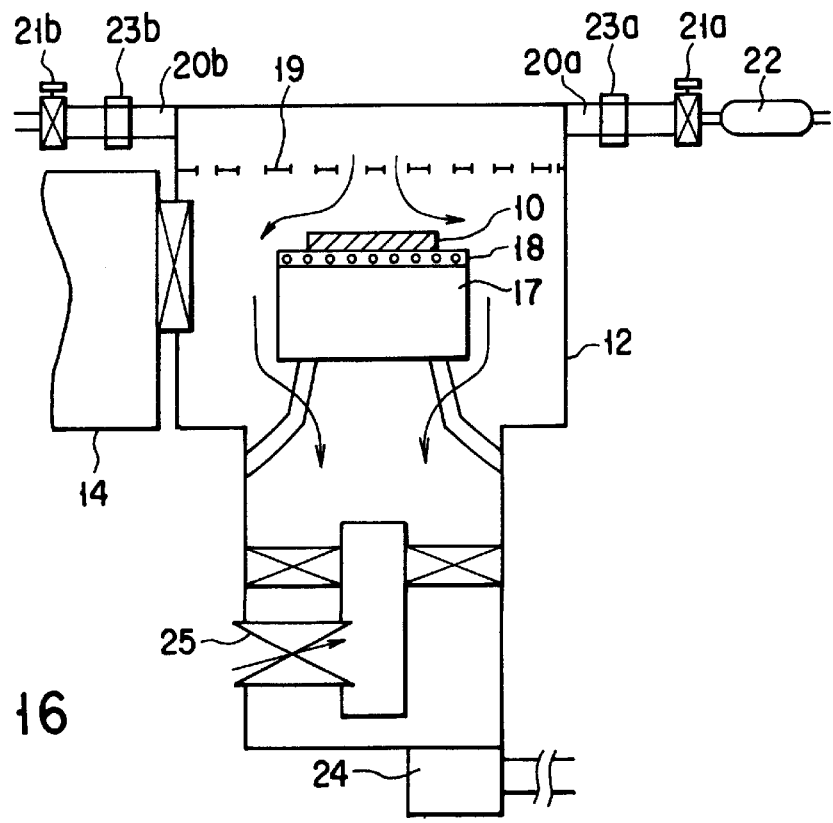
FIG. 16 schematically shows the construction of a process chamber for forming a silicon nitride film, which is included in the film-forming apparatus used for working the film-forming method according to the first to third and fifth embodiments of the present invention.
Figure 17:
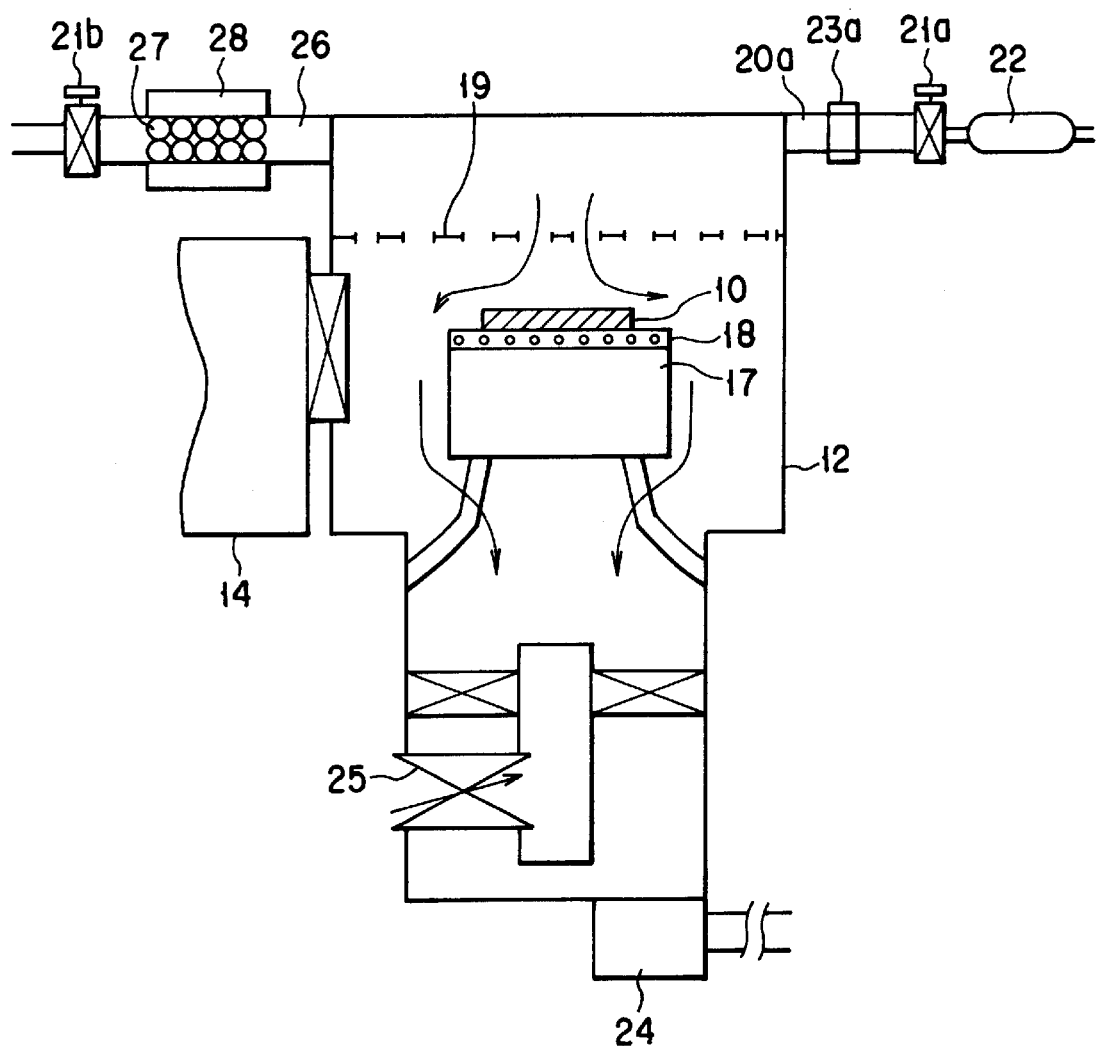
FIG. 17 schematically shows the construction of a process chamber for forming a silicon nitride film, which is included in the film-forming apparatus used for working the film-forming method according to the fourth embodiment of the present invention.

FIG. 15 is a plan view schematically showing the film-forming apparatus, one-by-one type cluster CVD apparatus, used in the method according to the first to fifth embodiments of the present invention. FIG. 16 schematically shows the construction of the silicon nitride film-forming chamber included in the film-forming apparatus used in the first to third and fifth embodiments of the present invention. Further, FIG. 17 schematically shows the construction of the silicon nitride film-forming chamber included in the film-forming apparatus used in the fourth embodiment of the present invention.

The one-by-one type cluster CVD apparatus shown in FIG. 15 consists essentially of a silicon nitride film-forming chamber 12, a polycrystalline silicon-forming chamber 13, a transfer chamber 14, a loading chamber 15 and an unloading chamber 16. The degrees of the background vacuum in the chambers 12 to 16 are controlled to be at most $10^{-8}$ Torr, $10^{-8}$ Torr, $10^{-9}$ Torr, $10^{-6}$ Torr, and $10^{-6}$ Torr, respectively. Also, a silicon substrate 10 having the surface terminated with hydrogen is housed in a nitrogen purge box 11 in order to prevent the substrate 10 from being exposed to the atmosphere for a long time and, then, transferred into the one-by-one type cluster CVD apparatus.

After formation of a silicon nitride film in the chamber 12, the chamber 12 is evacuated to a vacuum. The silicon substrate 10 having a silicon nitride film formed thereon is transferred from the chamber 12 into the polycrystalline silicon-forming chamber 13 through the transfer chamber 14. Since a plurality of chambers arranged to form a cluster, a low temperature process and a high temperature process can be carried out within different chambers. It follows that it is possible to shorten the time required for the heating or cooling of the substrate. For example, the loading and unloading of the silicon substrate 10 can be carried out under the conditions that the silicon nitride film-forming chamber 12 is held at room temperature or less and the polycrystalline silicon-forming chamber 13 is held at 300° C. or more.

In the method according to the first to third and fifth embodiments of the present invention, the in-situ room temperature nitridation, low temperature silane adsorption, etc. of the (100) plane terminated with hydrogen of the silicon substrate 10 are carried out within the silicon nitride film-forming chamber 12 shown in FIG. 16. As shown in the drawing, a cooling mechanism 17, e.g., holder cooling using a liquid nitrogen, and a heating mechanism, e.g., resistance heater, for cooling or heating the substrate 10 are arranged within the silicon nitride film-forming chamber 12. Also, a porous nozzle 19 is arranged above the silicon substrate 10 in a manner to face the silicon substrate 10. Further, boron nitride (BN) tubes 20a and 20b for supplying active species of nitrogen and a silane gas, respectively, are arranged upstream of the nozzle 19. These gases are supplied in the form of a pulse-wise stream by using piezo valves 21a and 21b. Incidentally, the discharge tube is made of BN, not quartz. In the case of using quartz, oxygen is likely to be generated from the tube wall during the discharge, and the oxygen thus generated is likely to enter the silicon nitride film. In other words, the discharge tube made of BN makes it possible to form a silicon nitride film low in impurity content and in defect density.

Traces of oxygen and water are removed from a raw material nitrogen gas in a purifier 22. Then, the purified nitrogen gas and a silane gas are supplied into the silicon nitride film-forming chamber 12 through the BN tubes 20a, 20b and the porous nozzle 19. It should be noted that microwave cavities 23a, 23b are formed on the outer surfaces of the BN tubes, with the result that a discharge treatment can be applied to the nitrogen gas, etc. The nitrogen pressure within the silicon nitride film-forming chamber 12 can be increased to 1 Torr by a conductance valve 25 mounted to a head of a turbo molecular pump 24.

As described above, a silicon nitride film or the like can be formed efficiently by the method according to the first to third and fifth embodiments of the present invention by using the apparatus shown in FIGS. 15 and 16.

In the method according to the fourth embodiment of the present invention, an in-situ room temperature nitridation, a low temperature silane adsorption, etc. of the (100) plane terminated with hydrogen of the silicon substrate 10 are carried out in, for example, the silicon nitride film-forming chamber 12 shown in FIG. 17. Incidentally, the members of the silicon nitride film-forming chamber common with FIGS. 16 and 17 are denoted by the same reference numerals, and reference thereto is omitted in the following description.

As shown in FIG. 17, a quartz tube 26 is arranged in place of the BN tube 20b within the silicon nitride film-forming chamber 12. Silicon particles 27 are loaded in the quartz tube 26. Also, a heating mechanism 28 is wound about the quartz tube 26 so as to heat the silicon particles 27 loaded in the quartz tube 26 to a predetermined temperature. An $SiF_4$ gas is supplied from upstream of the quartz tube 26, with the result that $SiF_4$ is brought into contact with the heated silicon particles 27 within the quartz tube 26 so as to generate :$SiF_2$ radicals. The resultant :$SiF_2$ radicals are supplied through the nozzle 19 onto the surface of the substrate 10. It should be noted that a piezo valve 21b is mounted to the quartz tube 26, with the result that the :$SiF_2$ radicals are supplied in the form of a pulse.

A silicon nitride film or the like can be formed efficiently by the method according to the fourth embodiment of the present invention by using the apparatus shown in FIGS. 15 and 17.

A down flow plasma using a microwave discharge is employed in the embodiments described above for forming and supplying active species. Alternatively, a down flow plasma using an electron cyclotron resonance plasma (ECR) or an ion cyclotron plasma (ICP) can also be employed in the present invention for forming and supplying active species. Further, a microwave cavities are used for activation of nitrogen in the embodiment described above. Alternatively, it is also possible to use a thermionic current generated from a tungsten filament in place of the microwave cavities. It is also possible to form active species of nitrogen by allowing a nitrogen molecule stream to collide against platinum. Further, an infrared ray lamp or a laser can be used in place of the resistance heater as the heating mechanism. The effects similar to those obtained in the case of using a resistance heater can be obtained in the case of using an infrared ray lamp or a laser.

Further, in the apparatus shown in FIGS. 15 to 17, a plurality of process chambers are arranged to form a cluster. However, it is also possible to carry out a plurality of process steps within a single process chamber. In this case, a longer time is required for heating or cooling the substrate. However, the effects similar to those described previously can also be obtained.

In each of the first to fifth embodiments described above, silane, disilane or :$SiF_2$ radicals are used as a chemical substance containing silicon. Alternatively, $SiF_4$, $SiCl_4$, etc. can also be used as a chemical substance containing silicon. Also, a silicon nitride film is formed by using nitrogen radicals in the embodiments described above. Alternatively, a silicon nitride film can be formed by nitridation, for example, of a silicon film with an ammonia gas. In this case, heating is required for forming a silicon nitride film. However, it is possible to obtain a silicon nitride film superior in flatness and film thickness controllability to the silicon nitride film obtained by the conventional method. Further, the raw material gas such as a silane gas and a nitrogen gas can be diluted with a noble gas such as a He gas or an Ar gas, with substantially the same effects.

If nitrogen is replaced by oxygen, a silicon oxide film can also be formed by the method of the present invention in place of the silicon nitride film. Further, an oxynitride film of a laminate structure consisting of a silicon nitride layer and a silicon oxide layer can be formed by alternately stacking a monomolecular nitride layer and a monomolecular oxide layer. Still further, a film having a high dielectric constant such as a $TiO_2$ film can be formed by using a Ti-based gas such as $TiCl_4$ in place of silane gas, etc. and by using oxygen in place of nitrogen. In this case, the $TiO_2$ film can be formed while controlling the film thickness on the molecule level.

What should also be noted is that the defects within or at the interface of the formed film can be repaired while saturating the nitriding reaction or the like on the film surface by carrying out the reaction of a gas such as a nitrogen gas or oxygen gas at high temperatures or for a long time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a film, comprising the steps of:

allowing a first chemical substance to be adsorbed on a surface of a silicon substrate by a gaseous phase method;

forming a silicon compound layer on the silicon substrate by introducing a gas containing a second chemical substance onto the substrate surface having the first chemical substance adsorbed thereon, said silicon compound layer consisting essentially of a silicon compound formed by a reaction between the first chemical substance adsorbed on the substrate surface and the second chemical substance;

wherein one of said first or second chemical substances contains silicon and the other of said first or second chemical substances contains an element other than silicon;

said step of forming the silicon compound layer is continued until the reaction between the first chemical substance and the second chemical substance is saturated;

the step of allowing the first chemical substance to be adsorbed on the substrate surface and the step of forming the silicon compound layer are carried out alternately and a plurality of times; and at least one of said first and second chemical substances is a radical.

2. The method according to claim 1, wherein said first chemical substance contains silicon, and said second chemical substance contains an element other than silicon.

3. The method according to claim 2, further comprising the step of nitriding a surface of said substrate by supplying a gas containing said second chemical substance onto the substrate surface before the adsorption step of said first chemical substance.

4. The method according to claim 1, wherein said steps of adsorbing the first chemical substance and forming a silicon compound layer are carried out while keeping the surface of the silicon substrate at temperatures not higher than 600° C.

5. The method according to claim 1, wherein said steps of adsorbing the first chemical substance and forming a silicon compound layer are carried out while keeping the surface of the silicon substrate at temperatures not higher than 400° C.

6. The method according to claim 1, wherein said element other than silicon is nitrogen and said silicon compound layer consists essentially of silicon nitride.

7. The method according to claim 1, wherein at least one of said first and second chemical substances is supplied onto the substrate surface in the form of a down flow plasma.

8. The method according to claim 1, wherein at least one of said first and second chemical substances is an active species.

9. The method according to claim 1, wherein said first chemical substance is a :$SiF_2$ radical.

10. The method according to claim 1, wherein said second chemical substance is a nitrogen radical.

11. The method according to claim 1, wherein said step of forming a silicon compound layer is carried out while heating the substrate surface having said first chemical substance adsorbed thereon.

12. The method according to claim 1, wherein said step of adsorbing the first chemical substance is carried out while heating the surface of the silicon substrate.

13. The method according to claim 1, wherein said step of adsorbing the first chemical substance is carried out while cooling the surface of the silicon substrate.

14. The method according to claim 1, wherein said step of adsorbing the first chemical substance comprises chemically adsorbing the first chemical substance on the surface of the silicon substrate.

15. The method according to claim 1, wherein said step of adsorbing the first chemical substance comprises physically adsorbing the first chemical substance on the surface of the silicon substrate.

16. The method according to claim 1, wherein said step of adsorbing the first chemical substance is continued until the adsorption of the first chemical substance on the surface of the silicon substrate is saturated.

17. The method according to claim 1, further comprising the step of continuously supplying one of the first and second chemical substances by a gaseous phase method and continuously or intermittently supplying the other of the first and second chemical substances, after steps of adsorbing the first chemical substance and forming a silicon compound layer, which are alternately carried out a plurality of times.

18. The method according to claim 1, wherein one of said first or second chemical substances is selected from the group consisting of a compound of silicon and hydrogen, a compound of silicon and halogen element, and a radical thereof, and the other chemical substance is selected from the group consisting of nitrogen, nitrogen radical, and ammonia.

19. The method according to claim 1, further comprising the steps of:

allowing a third chemical substance to be adsorbed on the surface of the silicon substrate by a gaseous phase method; and forming a silicon oxide layer on the silicon substrate by introducing a gas containing a fourth chemical substance onto the substrate surface having the third chemical substance adsorbed thereon, said silicon oxide layer being formed by a reaction between the third chemical substance adsorbed on the substrate surface and the fourth chemical substance, wherein one of said first or second chemical substances contains silicon and the other of said first or second chemical substances contains nitrogen, said silicon compound layer is a silicon nitride layer, one of said third or fourth chemical substances contains silicon and the other of said third or fourth chemical substances contains oxygen, said step of forming the silicon oxide layer is continued until the reaction between the third chemical substance and said fourth chemical substance is saturated, said step of allowing the first chemical substance to be adsorbed on the substrate surface and said step of forming the silicon nitride layer constitute a first process, said step of allowing the third chemical substance to be adsorbed on the substrate surface and said step of forming the silicon oxide layer constitute a second process, and said first and second processes are carried out alternately and a plurality of times.

* * * * *